(12) United States Patent
Yagishita

(10) Patent No.: US 8,124,465 B2
(45) Date of Patent: Feb. 28, 2012

(54) METHOD FOR MANUFACTURING A SEMICONDUCTOR DEVICE HAVING A SOURCE EXTENSION REGION AND A DRAIN EXTENSION REGION

(75) Inventor: Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 12/748,032

(22) Filed: Mar. 26, 2010

(65) Prior Publication Data

US 2010/0184261 A1 Jul. 22, 2010

Related U.S. Application Data

(62) Division of application No. 11/717,067, filed on Mar. 13, 2007, now abandoned.

(30) Foreign Application Priority Data

Mar. 14, 2006 (JP) .................................... 2006-69580

(51) Int. Cl.
H01L 21/336 (2006.01)

(52) U.S. Cl. ................. 438/157; 257/E21.409

(58) Field of Classification Search .................. 438/157, 438/303; 257/E21.409, E21.561
See application file for complete search history.

(56) References Cited

U.S. PATENT DOCUMENTS

| | | | |
|---|---|---|---|
| 6,838,322 B2 | 1/2005 | Pham et al. | |
| 2005/0093154 A1* | 5/2005 | Kottantharayil et al. | 257/745 |
| 2005/0199948 A1 | 9/2005 | Lee et al. | |
| 2007/0076477 A1 | 4/2007 | Hwang et al. | |

FOREIGN PATENT DOCUMENTS

| | | | |
|---|---|---|---|
| JP | 2006-121074 | | 5/2006 |
| JP | 2006121074 A | * | 5/2006 |

OTHER PUBLICATIONS

Notification of Reasons for Rejection issued by the Japanese Patent Office on Mar. 11, 2011, for Japanese Patent Application No. 2006-069580, and English-language translation thereof.
Verheyen et al., "25% Drive Current Improvement for p-type Multiple Gate FET (MuGFET) Devices by the Introduction of Recessed $Si_{0.8}Ge_{0.2}$ in the Source and Drain Regions", Symposium on VLSI Technology Digest of Technical Papers, pp. 194-195, (2005).

* cited by examiner

Primary Examiner — Thomas L Dickey
(74) Attorney, Agent, or Firm — Finnegan, Henderson, Farabow, Garrett & Dunner, L.L.P.

(57) ABSTRACT

There is provided a semiconductor device including: convex semiconductor layers formed on a semiconductor substrate via an insulating film; gate electrodes formed on a pair of facing sides of the semiconductor layers via a gate insulating film; a channel region formed of silicon between the gate electrodes in the semiconductor layers; a source extension region and a drain extension region formed of silicon germanium or silicon carbon on both sides of the channel region in the semiconductor layers; and a source region formed of silicon so as to adjoin to the opposite side of the channel region in the source extension region, and a drain region formed of silicon so as to adjoin to the opposite side of the channel region in the drain extension region in the semiconductor layers.

12 Claims, 17 Drawing Sheets

METHOD FOR MANUFACTURING A SEMICONDUCTOR DEVICE HAVING A SOURCE EXTENSION REGION AND A DRAIN EXTENSION REGION

CROSS REFERENCE TO RELATED APPLICATION

This application is a divisional of U.S. patent application Ser. No. 11/717,067, filed Mar. 13, 2007, now abandoned which is based upon and claims benefit of priority under 35 USC 119 from the Japanese Patent Application No. 2006-69580, filed on Mar. 14, 2006, the entire contents of which are both incorporated herein by reference.

BACKGROUND OF THE INVENTION

The present invention relates to a semiconductor device and a method for manufacturing the same.

In recent years, an MOSFET of a so-called double-gate structure has been developed for the size reduction, low power consumption, and high speed of transistors; and among these, the MOSFET wherein a semiconductor layer is formed to have a Fin shape, is called a FinFET.

In a planar-type MOSFET, on the other hand, a technique to improve the mobility of carriers by applying stress to the channel region has been developed.

For example, in the planar-shaped PMOSFET, the mobility of holes is improved by burying silicon germanium (SiGe) in the source/drain region, and applying a compressive stress to the channel region. In the planar-shaped NMOSFET, on the other hand, the mobility of electrons is improved by burying silicon carbide (SiC) in the source/drain region, and applying a tensile stress to the channel region.

In recent years, also in the FinFET, a method wherein silicon germanium is used in the source/drain region has been proposed (for example, refer to Non-Patent Document 1). By this method, the driving current of the FinFET can be increased by etching the source/drain forming region in the semiconductor layer to the middle to remove a predetermined quantity thereof, and epitaxially growing silicon germanium.

According to this method, however, although etching must be stopped in the middle, there was a problem wherein it was difficult to stop etching evenly throughout the entire surface of the source/drain forming region.

Therefore, when a FinFET was formed on the SOI substrate, if the buried insulating film was exposed by performing etching to the bottom of the source/drain forming region, there was a problem wherein silicon was completely disappeared from the source/drain forming region including the contact plug forming region in semiconductor layers composed of silicon, and thereby, silicon germanium could not be epitaxially grown.

Furthermore, according to this method, since silicon germanium is formed only in the upper portion of the source/drain forming region, there was a problem wherein stress was applied only to the upper portion of the channel region, and stress was not sufficiently applied to the bottom portion of the channel region to adversely affect the electrical properties of the device.

The document regarding a FinFET that uses silicon germanium in the source/drain region will be shown below:

2005 Symposium on VLSI Technology Digest of Technical Papers, pp. 194-195.

SUMMARY OF THE INVENTION

A semiconductor device according to an embodiment of the present invention includes:

convex semiconductor layers formed on a semiconductor substrate via an insulating film;

gate electrodes formed on a pair of facing sides of the semiconductor layers via a gate insulating film;

a channel region formed of silicon between the gate electrodes in the semiconductor layers;

a source extension region and a drain extension region formed of silicon germanium or silicon carbon on both sides of the channel region in the semiconductor layers; and a source region formed of silicon so as to adjoin to the opposite side of the channel region in the source extension region, and a drain region formed of silicon so as to adjoin to the opposite side of the channel region in the drain extension region in the semiconductor layers.

A method for manufacturing a semiconductor device according to an embodiment of the present invention includes:

depositing a mask material on a first semiconductor layer formed of silicon on a semiconductor substrate via a buried insulating film, and patterning the mask material and the first semiconductor layer, to form a first semiconductor layer having a convex shape;

forming gate insulating films on a pair of facing sides of the first semiconductor layer;

depositing a gate electrode material of the buried insulating film, the gate insulating films, and the mask material, and pattering the gate electrode material, to form a gate electrode on the pair of facing sides and the upper surface of the first semiconductor layer via the gate insulating films and the mask material;

forming gate electrode sidewalls on the sides of the gate electrode, and removing the mask material formed on the first semiconductor layer and not coated by the gate electrode and the gate electrode sidewalls;

forming a source region and a drain region by the ion implantation of a predetermined impurity' into the first semiconductor layer using the gate electrode and the gate electrode sidewalls as masks;

forming an insulating film on the buried insulating film, the first semiconductor layer, the gate electrode, and the gate electrode sidewalls;

forming a mask having a pattern wherein the upper surfaces of the gate electrode sidewalls are opened on the insulating film;

exposing a part of the first semiconductor layer by etching the insulating film and the gate electrode sidewalls using the mask;

removing the mask, and etching off the exposed first semiconductor layer;

forming a second semiconductor layer composed of silicon germanium or silicon carbide on the removed region; and forming a source extension region and a drain extension region by the ion implantation of a predetermined impurity into the second semiconductor layer using the gate electrode and the insulating film as masks.

DETAILED DESCRIPTION OF THE INVENTION

Figure 1:
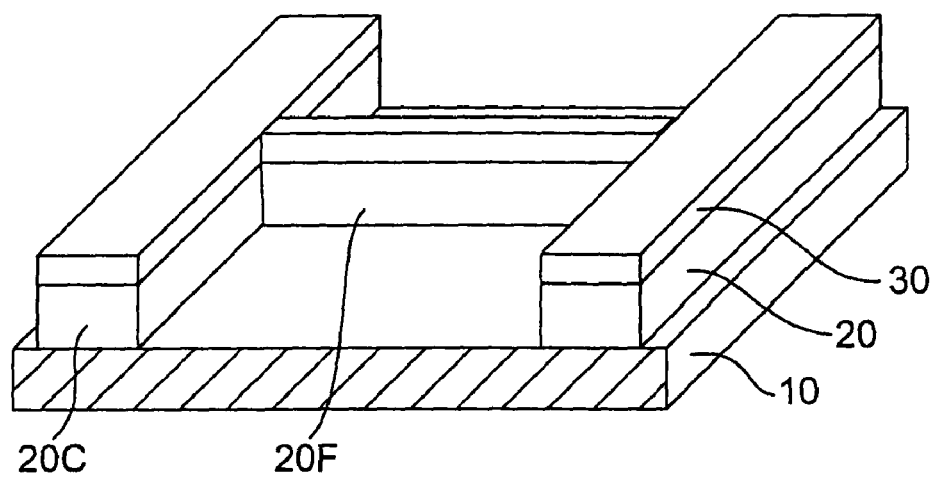
FIG. 1 is a longitudinal sectional view showing a cross-sectional structure of an element in each step in the method for manufacturing a semiconductor device according to the first embodiment of the present invention.

The embodiments of the present invention will be described below referring to the drawings.

(1) First Embodiment

FIGS. 1 to 10 illustrate the method for manufacturing a semiconductor device according to the first embodiment of the present invention. First, as FIG. 1 shows, an SOI substrate wherein a buried insulating film 10 and a semiconductor layer 20 having a thickness of about 50 nm sequentially laminated on a semiconductor substrate (not shown) is prepared. The semiconductor substrate and the semiconductor layer 20 are composed of, for example, silicon single crystals, and the buried insulating film 10 is composed of, for example, silicon oxide ($SiO_2$) film.

After depositing a mask material 30 composed, for example, of a silicon nitride (SIN) film having a thickness of about 70 nm on the semiconductor layer 20, the mask material 30 and the semiconductor layer 20 are sequentially patterned by lithography and RIE, to form a convex semiconductor layer 20 consisting of a fin 20F and a contact plug forming region 20C.

Figure 2:
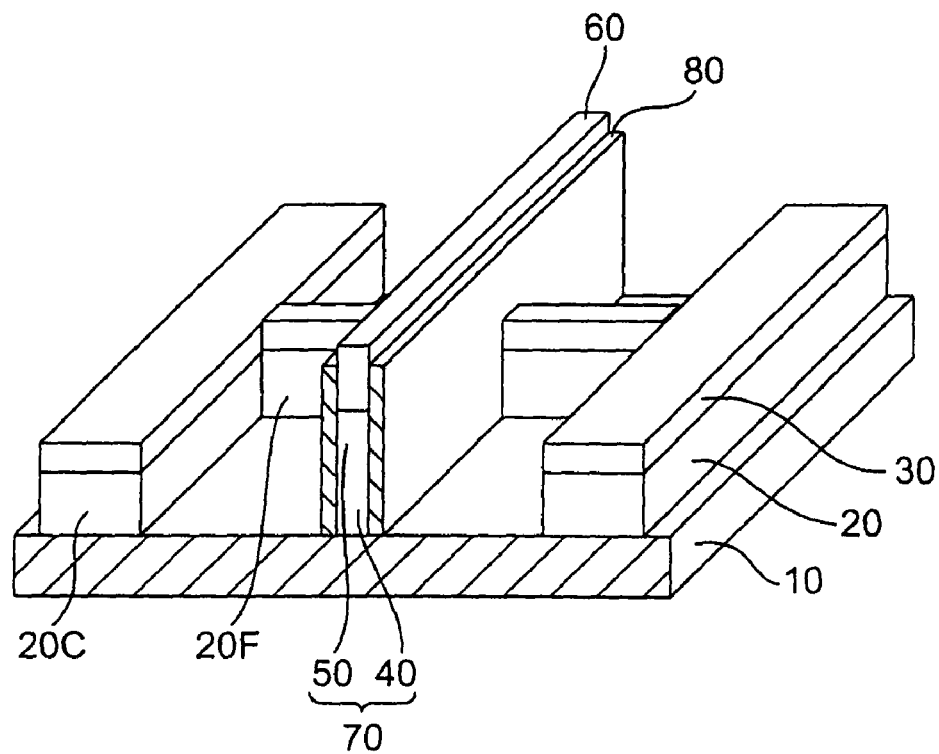
FIG. 2 is a longitudinal sectional view showing a cross-sectional structure of the element in each step in the method for manufacturing the same semiconductor device.

As FIG. 2 shows, a gate insulating film (not shown) composed, for example, of hafnium nitride silicate (HfSiON) film is formed on each of a pair of facing sides of the fin 20F. After depositing a gate electrode material 40 composed, for example, polysilicon, having a thickness of about 250 nm as a first layer using CVD or the like, the gate electrode material 40 is planarized by CMP using the mask material 30 as a stopper.

After depositing a gate electrode material 50 composed, for example, of polysilicon, having a thickness of about 50 nm as a second layer using CVD or the like, a mask material 60 composed, for example, of a silicon nitride (SiN) film having a thickness of about 120 nm is deposited on the gate electrode material 50. The mask material 60 and the gate electrode materials 50 and 40 are sequentially patterned using lithography and RIE to form a gate electrode 70.

Thereafter, a first gate electrode sidewall material composed, for example, of a silicon nitride film of a thickness of about 5 nm is deposited on the entire surface, and the first gate electrode sidewall material is etched using RIE to form first gate electrode sidewalls 80 on the sides of the gate electrode 70 and the mask material 60.

Figure 3:
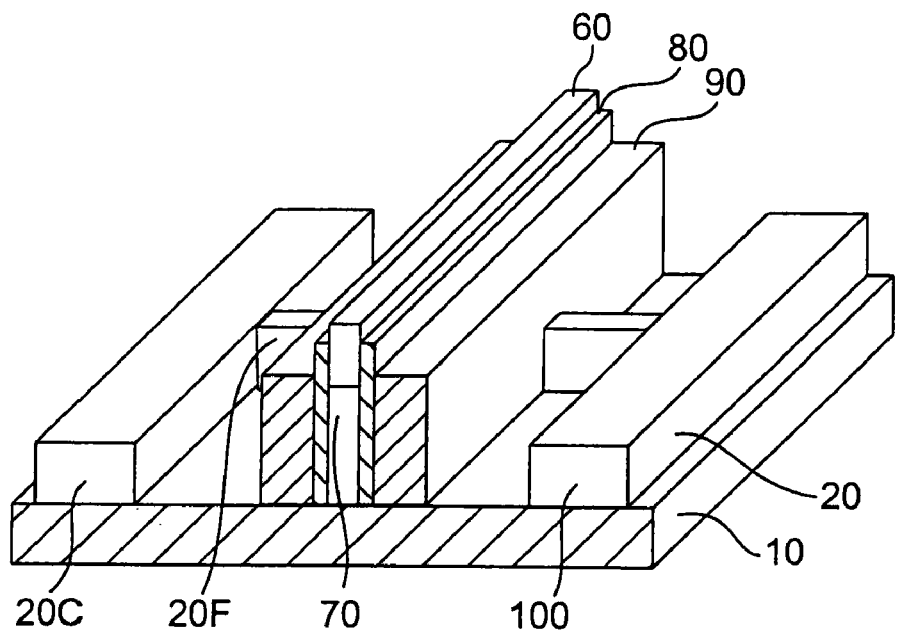
FIG. 3 is a longitudinal sectional view showing a cross-sectional structure of the element in each step in the method for manufacturing the same semiconductor device.

As FIG. 3 shows, after depositing a second gate sidewall material composed, for example, of a TEOS film having a thickness of about 30 nm, the second gate electrode sidewall material is etched using RIE, to form second gate electrode sidewalls 90 on the sides of the first gate electrode sidewalls 80.

At this time, in the semiconductor layer 20, the mask material 30 formed on the source/drain forming region where a source/drain region is subsequently formed is removed, and the film thickness of the mask material 60 formed on the gate electrode 70 reduced to about 50 nm.

Thereafter, by performing ion implantation into the semiconductor layer 20 by plasma doping or angle ion implantation using the mask material 60, and the first and second gate electrode sidewalls 80 and 90 as masks, a source/drain region 100 having a deep junction depth in the lateral direction in the drawing is formed in the contact plug forming region 20C and a part of the fin 20F in the semiconductor layer 20. In this case, silicon can be epitaxially grown on the upper surface and sides of the exposed semiconductor layer 20 before performing ion implantation.

Figure 4:
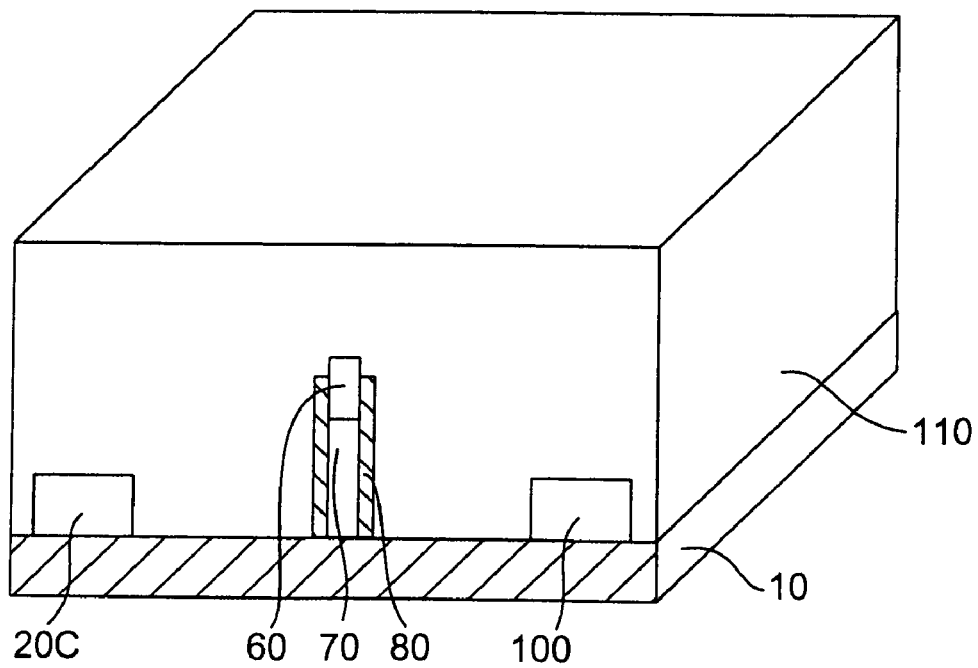
FIG. 4 is a longitudinal sectional view showing a cross-sectional structure of the element in each step in the method for manufacturing the same semiconductor device.

Then, a silicide, such as nickel silicide (NiSi) (not shown), is formed on the surface portion of the source/drain region 100. As FIG. 4 shows, after depositing a thick insulating film 110 composed, for example, of a TEOS film, the insulating film 110 is planarized using CMP.

Figure 5:
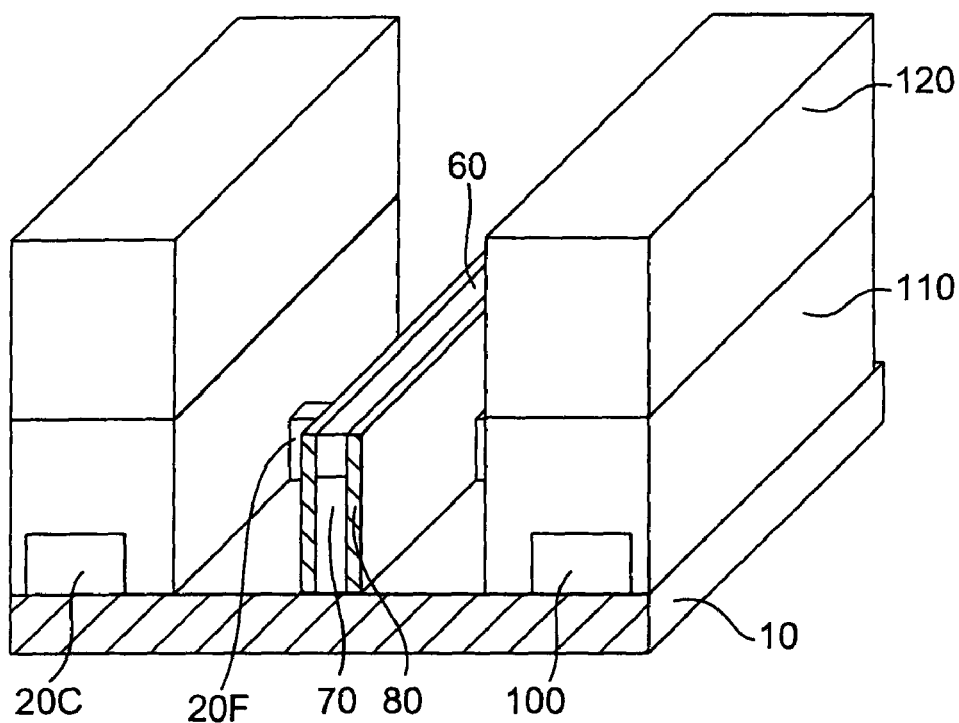
FIG. 5 is a longitudinal sectional view showing a cross-sectional structure of the element in each step in the method for manufacturing the same semiconductor device.

As FIG. 5 shows, a photo-resist is applied onto the insulating film 110, and exposed and developed to form a resist mask 120 having a pattern wherein the upper surface of the second gate electrode sidewall 90 is opened. By etching the insulating film 110 and the second gate electrode sidewall 90 by RIE using the resist mask 120 as a mask, a part of the insulating film 110 and the second gate electrode sidewall 90 are removed to expose a part of the fin 20F.

Figure 6:
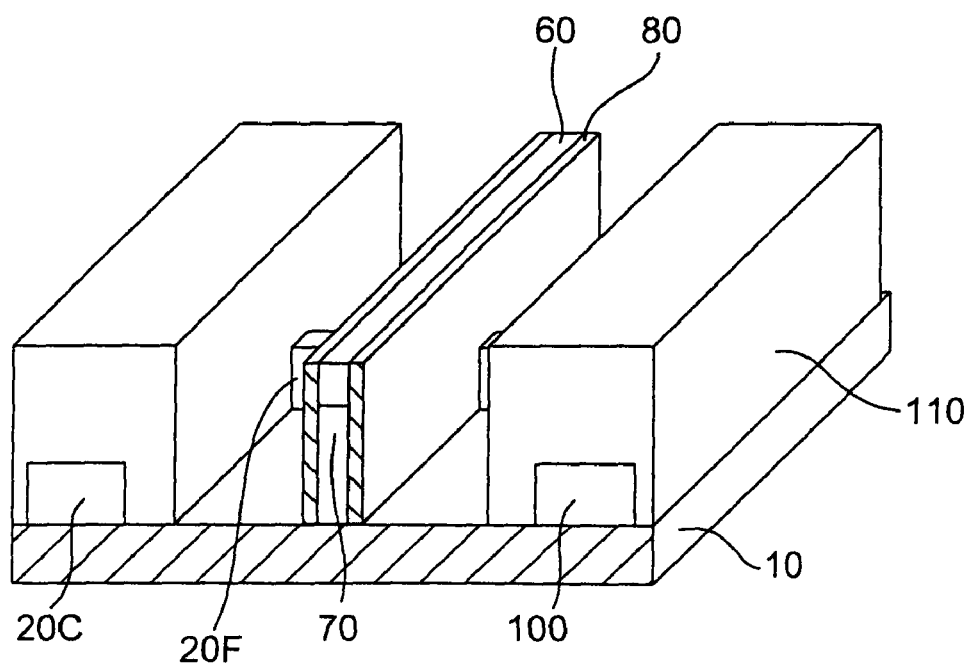
FIG. 6 is a longitudinal sectional view showing a cross-sectional structure of the element in each step in the method for manufacturing the same semiconductor device.
Figure 7:
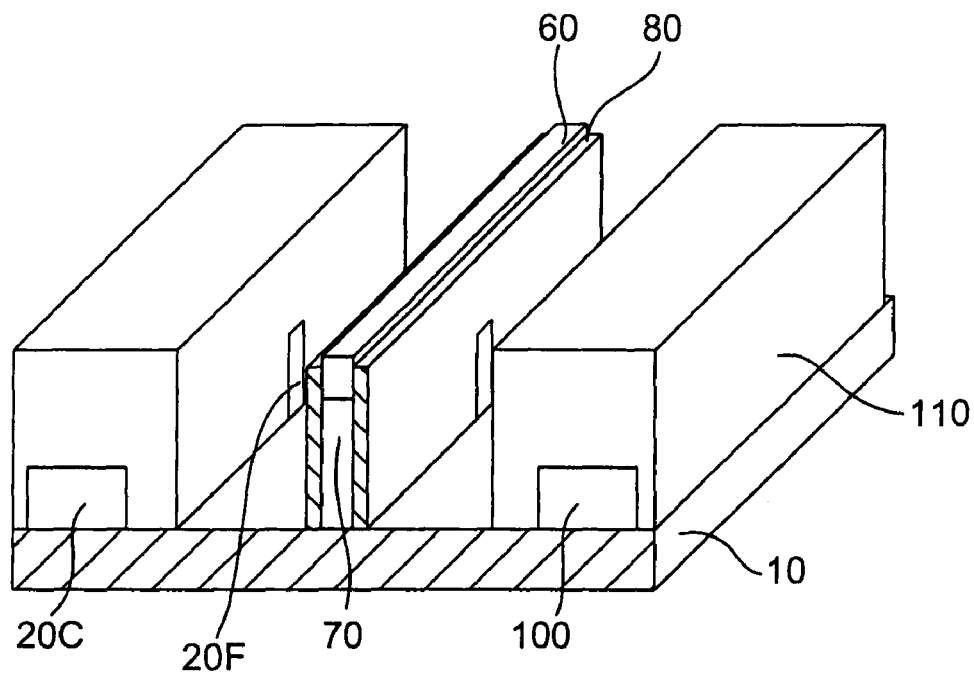
FIG. 7 is a longitudinal sectional view showing a cross-sectional structure of the element in each step in the method for manufacturing the same semiconductor device.

As FIG. 6 shows, after removing the resist mask 120, as FIG. 7 shows, the exposed fin 20F is etched off by RIE.

Figure 8:
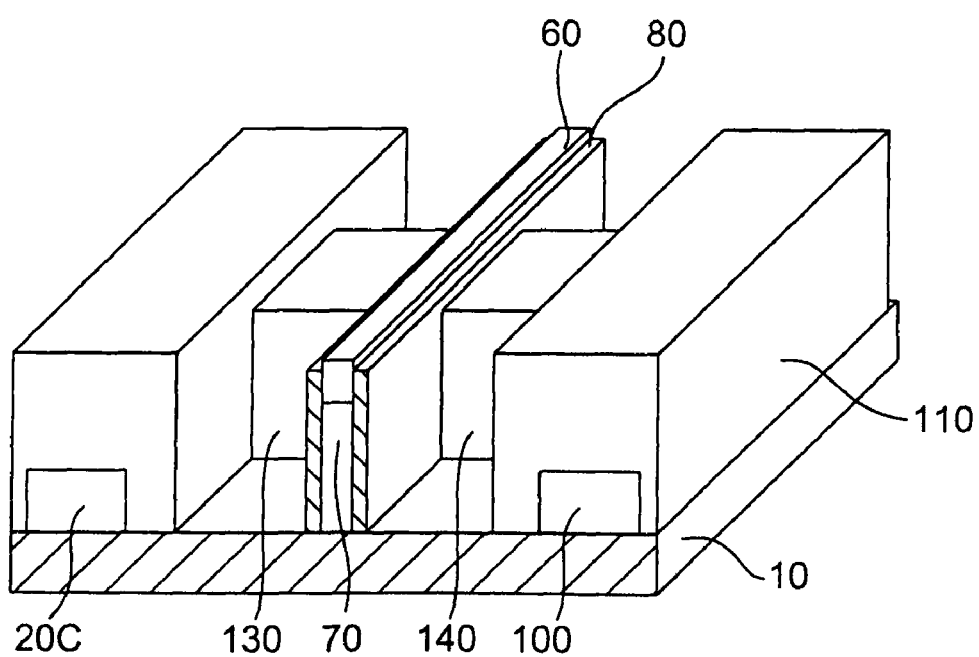
FIG. 8 is a longitudinal sectional view showing a cross-sectional structure of the element in each step in the method for manufacturing the same semiconductor device.

As FIG. 8 shows, by vapor-phase growth or solid-phase growth, silicon germanium is epitaxially grown using the sides of the fin 20F exposed on the sides of the first gate electrode sidewalls 80 and the insulating film 110 as seeds to form a fin 130 higher and wider than the fin 20F.

Next, an impurity, such as boron (B), is ion-implanted into the fin 130 to form a source/drain extension region 140, having a shallow junction depth in the lateral direction in the drawing and sharp impurity concentration distribution, in the fin 130. In this case, boron-doped silicon germanium can be formed as the fin 130.

Figure 9:
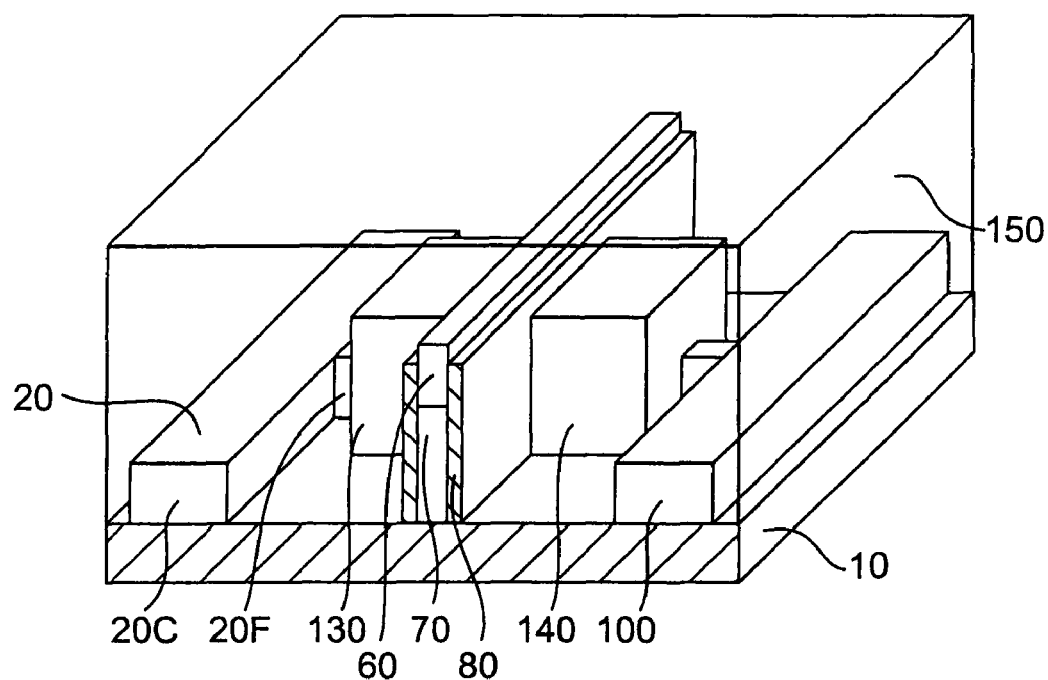
FIG. 9 is a longitudinal sectional view showing a cross-sectional structure of the element in each step in the method for manufacturing the same semiconductor device.

As FIG. 9 shows, an insulating film composed, for example, of a TEOS film is deposited, and the insulating film is planarized using CMP to form an interlayer insulating film 150. As FIG. 10 shows, contact plugs 160 are formed in the interlayer insulating film 150, and wiring steps are conducted to fabricate a FinFET 170, which is a PMOSFET.

Figure 10:
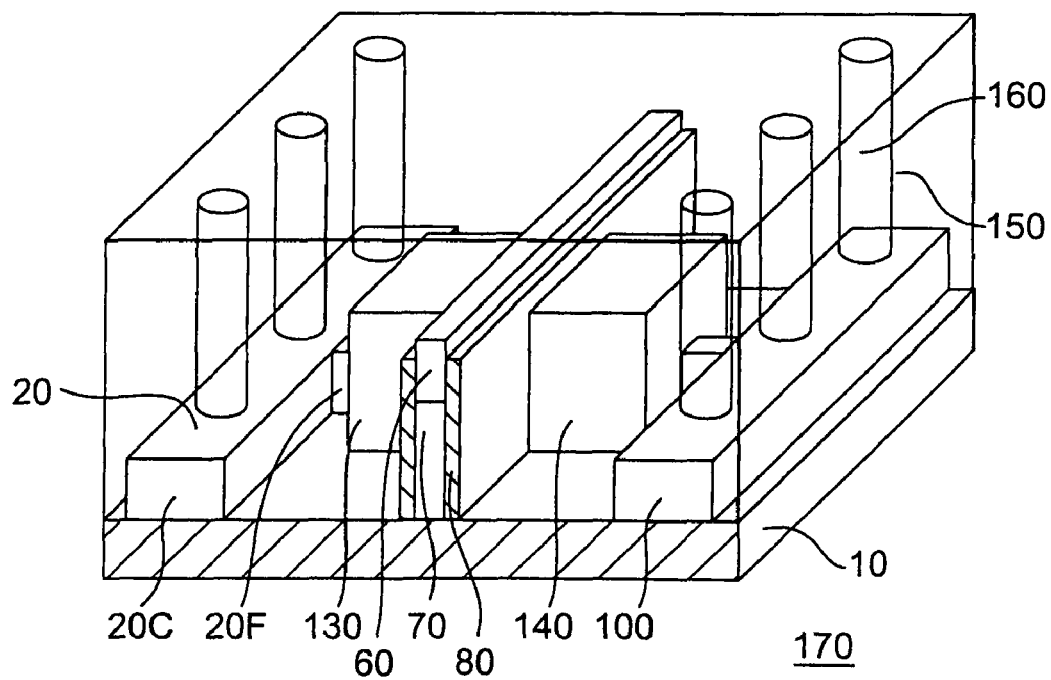
FIG. 10 is a longitudinal sectional view showing a cross-sectional structure of an element in each step in the method for manufacturing the same semiconductor device.

In the FinFET 170, which is a PMOSFET, fabricated using the above-described methods, as FIG. 10 shows, the buried insulating film 10 is formed on a semiconductor substrate (not shown), a semiconductor layer 20 having a fin 20F and a contact plug forming region 20C composed of silicon, and a fin 130 composed of silicon germanium is formed on the buried insulating film 10.

In the fin 20F (not shown) formed in the vicinity of the center portion of the semiconductor layer 20, a channel region (not shown) is formed. On both sides of the channel region and in the fin 130, a source/drain extension region 140 is formed; and in the fin 20F and the contact plug forming region 20C, a source/drain region 100 is formed so as to sandwich the source/drain extension region 140.

On both sides of the fin 20F in the vicinity of the channel region, a gate insulating film (not shown) is formed; and on the upper surface in the vicinity of the channel region, a mask material 30 (FIG. 2) is formed. On both sides and the upper surface of the fin 20F, a gate electrode 70 is formed via the gate insulating film and the mask material 30 to stride the fin 20F. On the upper surface of the gate electrode 70, a mask material 60 is formed, and on the sides of these gate electrode 70 and mask material 60, gate electrode sidewalls 80 are formed.

On the buried insulating film 10, the semiconductor layer 20, the mask material 60, and the gate electrode sidewalls 80, an interlayer insulating film 150 is formed; and on the upper surface of the contact region 20C in the semiconductor layer 20, contact plugs 160 are formed.

As described above, according to the first embodiment, in the FinFET 170, which is a PMOSFET, the channel region and the source/drain region 100 in the semiconductor layer 20 are formed of silicon; and the source/drain extension region 140 is formed of silicon germanium.

However, if the source/drain region 100 is also formed of silicon germanium, irregularity is formed in the boundary between the silicide and the source/drain region 100, which causes a problem of the abnormal growth of silicide to generate a junction leakage current. Whereas, according to the first embodiment, while improving the mobility of carriers, the abnormal growth of silicide and the generation of junction leakage current can be suppressed.

Also according to the first embodiment, silicon germanium can be evenly formed from the upper portion to the bottom portion of the fin 130, and thereby, the mobility of carriers can be improved evenly from the upper portion to the bottom portion of the channel region.

Also according to the first embodiment, by forming the fin 130 higher and wider than the fin 20F, the parasitic resistance can be reduced.

Also according to the first embodiment, when a part of the fin 20F in the semiconductor layer 20 is removed, the disappearance of all silicon in the source/drain forming region including the contact region 20C can be prevented, and thereby, impossibility of the epitaxial growth of silicon germanium can be avoided.

Further according to the first embodiment, since the source/drain region 100 that requires a high-temperature heating step is formed before the source/drain extension region 140, change in the impurity concentration distribution of the source/drain extension region 140 can be suppressed.

(2) Second Embodiment

FIGS. 11 to 18 illustrate the method for manufacturing a FinFET according to the second embodiment of the present invention. In the case of the second embodiment, a method for manufacturing a FinFET having a plurality of fins will be described. The elements same as the elements shown in FIGS.

1 to 10 are denoted by the same numerals and characters, and the description thereof will be omitted.

Figure 11:
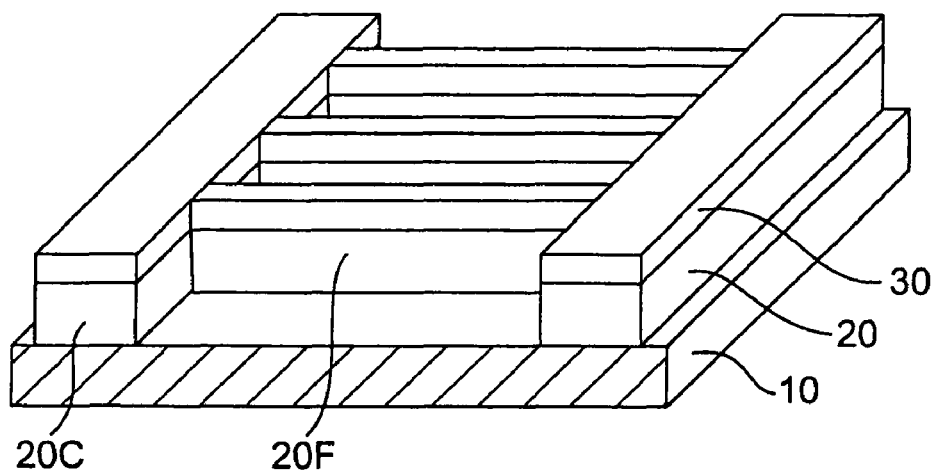
FIG. 11 is a longitudinal sectional view showing a cross-sectional structure of the element in each step in the method for manufacturing a semiconductor device according to the second embodiment of the present invention.

As FIG. 11 shows, in the same manner as in the first embodiment, an SOI substrate wherein a buried insulating film 10 and a semiconductor layer 20 sequentially laminated on a semiconductor substrate (not shown) is prepared. After depositing a mask material 30 composed, for example, of a silicon nitride (SiN) film having a thickness of about 70 nm on the semiconductor layer 20, the mask material 30 and the semiconductor layer 20 are sequentially patterned by lithography and RIE, to form a convex semiconductor layer consisting of three fins 20F and a contact region 20C.

Figure 12:
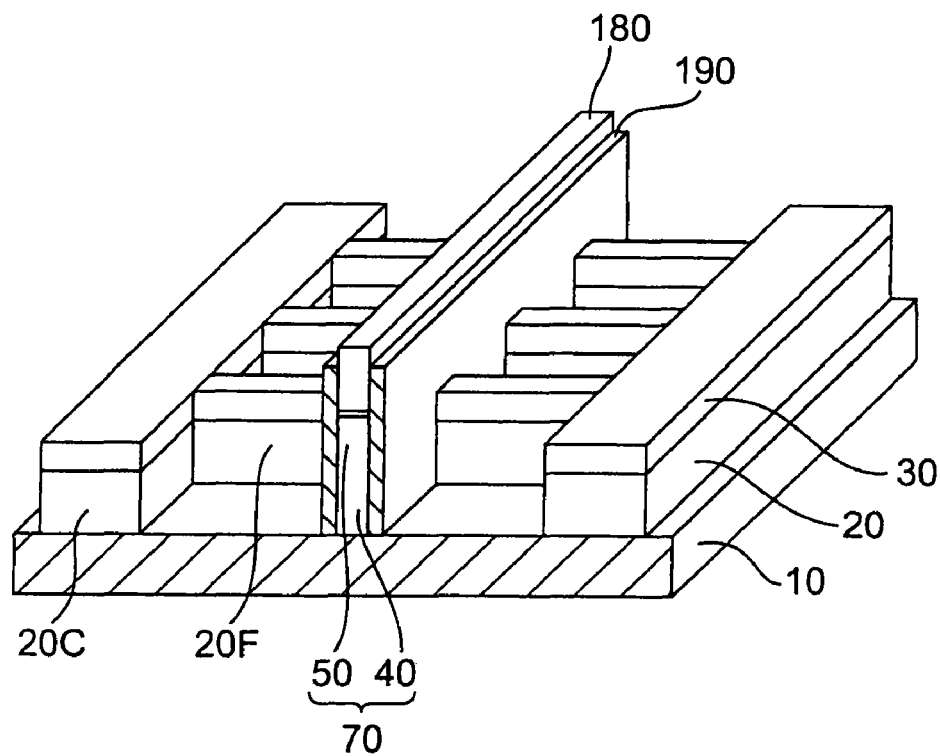
FIG. 12 is a longitudinal sectional view showing a cross-sectional structure of the element in each step in the method for manufacturing the same semiconductor device.

As FIG. 12 shows, in the same manner as in the first embodiment, a gate insulating film (not shown) is formed on each of a pair of facing sides of the fin 20F. After depositing a gate electrode material 40 as a first layer using CVD or the like, the gate electrode material 40 is planarized by CMP using the mask material 30 as a stopper.

After depositing a gate electrode material 50 as a second layer using CVD or the like, a mask material 180 composed, for example, of a silicon oxide ($SiO_2$) film is deposited on the gate electrode material 50. The mask material 180 and the gate electrode materials 50 and 40 are sequentially patterned using lithography and RIE to form a gate electrode 70.

Thereafter, a first gate electrode sidewall material composed, for example, of a silicon oxide film of a thickness of about 7 nm is deposited on the entire surface, and the first gate electrode sidewall material is etched using RIE to form first gate electrode sidewalls 190 on the sides of the gate electrode 70 and the mask material 180.

Figure 13:
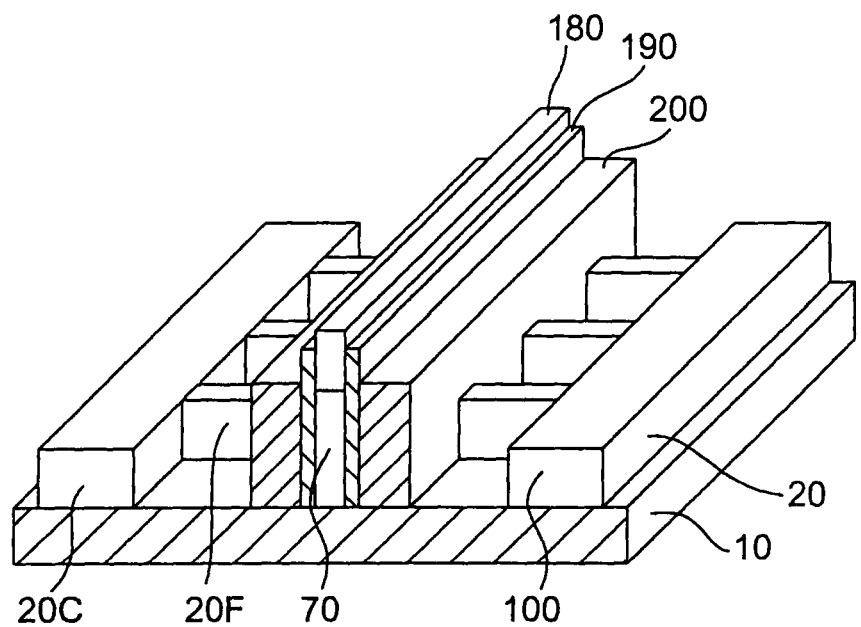
FIG. 13 is a longitudinal sectional view showing a cross-sectional structure of the element in each step in the method for manufacturing the same semiconductor device.

As FIG. 13 shows, after depositing a second gate sidewall material composed, for example, of a silicon nitride film whose etching rate is high, having a thickness of about 40 nm is deposited on the entire surface, the second gate electrode sidewall material is etched using RIE, to form second gate electrode sidewalls 200 on the sides of the first gate electrode sidewalls 190.

At this time, in the same manner as in the first embodiment, in the semiconductor layer 20, the mask material 30 formed on the source/drain forming region is removed, and the film thickness of the mask material 180 formed on the gate electrode 70 reduced to about 40 nm.

Figure 14:
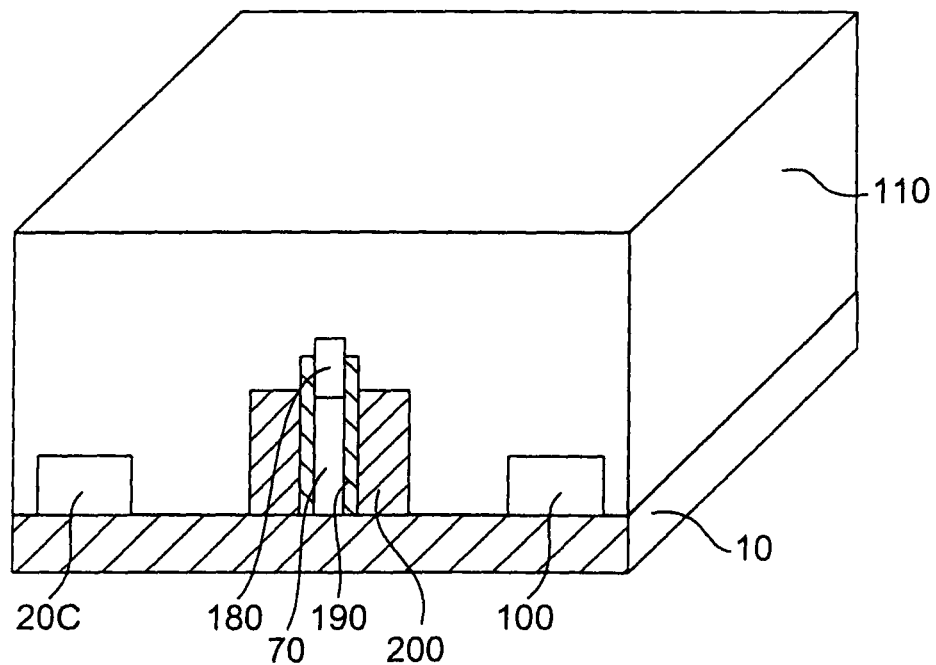
FIG. 14 is a longitudinal sectional view showing a cross-sectional structure of the element in each step in the method for manufacturing the same semiconductor device.

Thereafter, in the same manner as in the first embodiment, by performing ion implantation into the semiconductor layer 20, a source/drain region 100 having a deep junction depth in the lateral direction in the drawing is formed in the contact plug forming region 20C and a part of the fin 20F in the semiconductor layer 20. Then, a silicide (not shown), is formed on the surface portion of the source/drain region 100. As FIG. 14 shows, after depositing a thick insulating film 110 composed, for example, of a TEOS film, the insulating film 110 is planarized using CMP.

Figure 15:
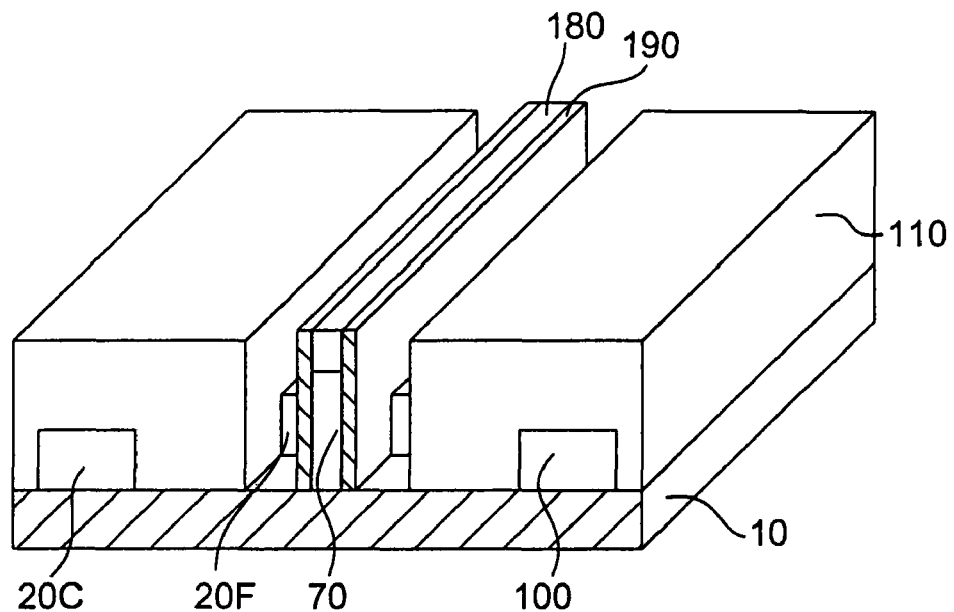
FIG. 15 is a longitudinal sectional view showing a cross-sectional structure of the element in each step in the method for manufacturing the same semiconductor device.

As FIG. 15 shows, the insulating film 110, the mask material 180, and the first gate electrode sidewalls 190 are etched by RIE to expose the upper surface of the second gate electrode sidewalls 200.

Figure 16:
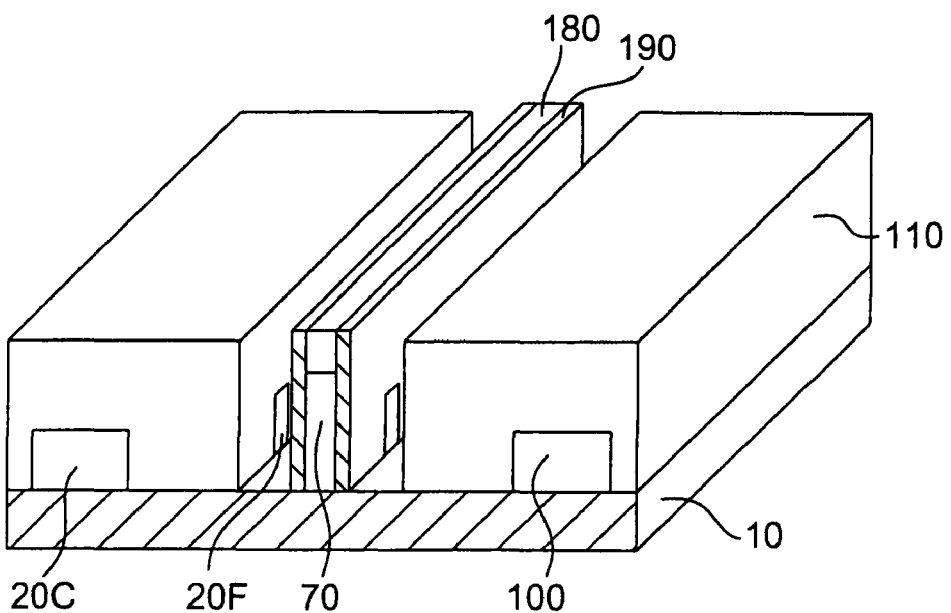
FIG. 16 is a longitudinal sectional view showing a cross-sectional structure of the element in each step in the method for manufacturing the same semiconductor device.

By wet etching using hot phosphoric acid, the second gate electrode sidewalls 200 composed of the silicon nitride film having higher etching rate than the silicon oxide film and the TEOS film is selectively removed to expose a part of the fin 20F. As FIG. 16 shows, in the same manner as in the first embodiment, the exposed fin 20F is etched off by RIE.

Figure 17:
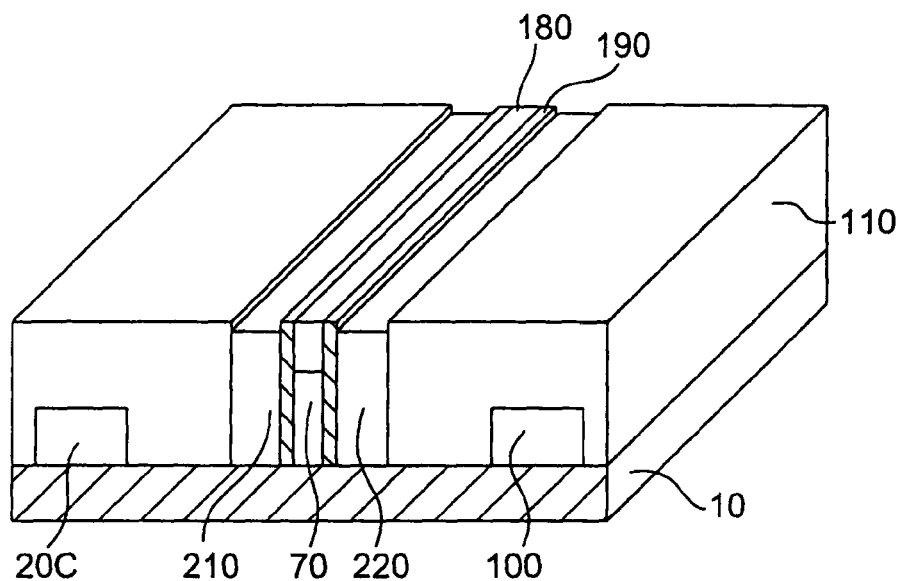
FIG. 17 is a longitudinal sectional view showing a cross-sectional structure of the element in each step in the method for manufacturing the same semiconductor device.

As FIG. 17 shows, by vapor-phase growth or solid-phase growth, silicon germanium is epitaxially grown using the sides of the fin 20F exposed on the sides of the first gate electrode sidewalls 190 and the insulating film 110 as seeds to form a silicon germanium layer 210. At this time, the fins 20F adjoining each other are connected by the silicon germanium layer 210.

Next, an impurity, such as boron (B), is ion-implanted into the silicon germanium layer 210 to form a source/drain extension region 220, having a shallow junction depth in the lateral direction in the drawing and sharp impurity concentration distribution, in the silicon germanium layer 210.

Figure 18:
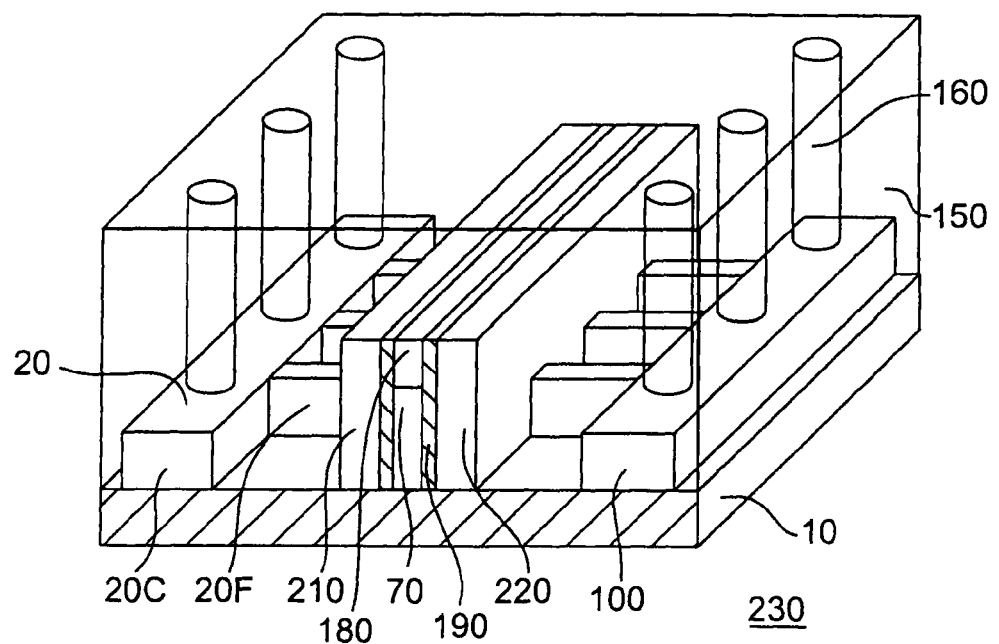
FIG. 18 is a longitudinal sectional view showing a cross-sectional structure of the element in each step in the method for manufacturing the same semiconductor device.

As FIG. 18 shows, in the same manner as in the first embodiment, an insulating film is deposited, and the insulating film is planarized using CMP to form an interlayer insulating film 150. Then, contact plugs 160 are formed in the interlayer insulating film 150, and wiring steps are conducted to fabricate a FinFET 230, which is a PMOSFET.

As FIG. 18 shows, the FinFET 230, which is a PMOSFET fabricated using the above-described methods, is formed so that a plurality of adjoining fins 20F are connected by the silicon germanium layer 210.

As described above, according to the second embodiment, in the same manner as in the first embodiment, while improving the mobility of carriers, the abnormal growth of silicide and the generation of junction leakage current can be suppressed.

Also according to the second embodiment, in the same manner as in the first embodiment, the silicon germanium layer 210 can be evenly formed from the upper portion to the bottom portion, and thereby, the mobility of carriers can be improved evenly from the upper portion to the bottom portion of the channel region.

Also according to the second embodiment, by connecting a plurality of adjoining fins 20F by the silicon germanium layer 210, the parasitic resistance can be further reduced compared with the first embodiment.

Also according to the second embodiment, in the same manner as in the first embodiment, when a part of the fin 20F in the semiconductor layer 20 is removed, the disappearance of all silicon in the source/drain forming region including the contact plug forming region 20C can be prevented, and thereby, impossibility of the epitaxial growth of silicon germanium can be avoided.

Further according to the second embodiment, in the same manner as in the first embodiment, since the source/drain region 100 that requires a high-temperature heating step is formed before the source/drain extension region 220, change in the impurity concentration distribution of the source/drain extension region 220 can be suppressed.

(3) Third Embodiment

FIGS. 19 to 28 illustrate the method for manufacturing a FinFET according to the third embodiment of the present invention. In the case of the third embodiment, an ordinary semiconductor substrate is prepared, and a FinFET is formed on the semiconductor substrate. Here, the same steps as in the first embodiment are implemented on the ordinary semiconductor substrate. The elements same as the elements shown in FIGS. 1 to 10 are denoted by the same numerals and characters, and the description thereof will be omitted.

Figure 19:
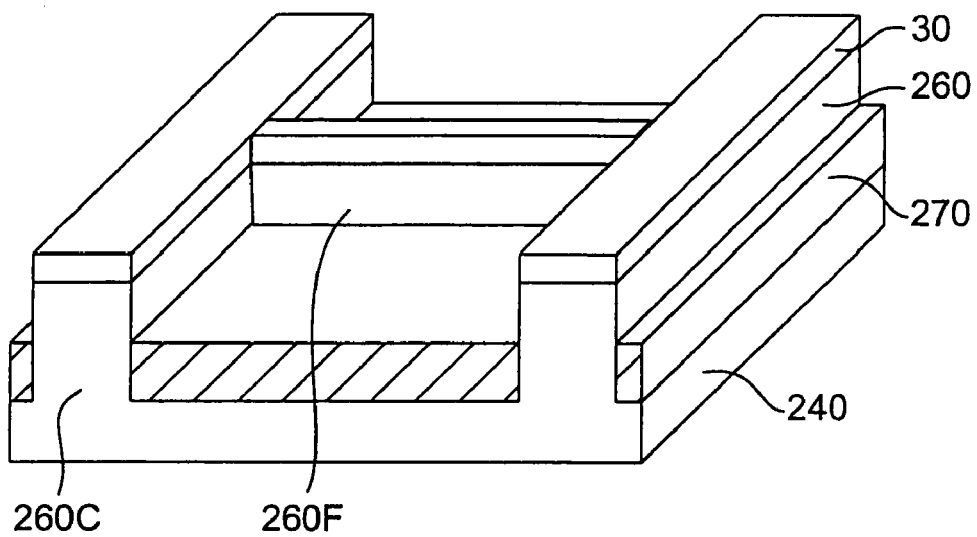
FIG. 19 is a longitudinal sectional view showing a cross-sectional structure of an element in each step in the method for manufacturing a semiconductor device according to the third embodiment of the present invention.
Figure 20:
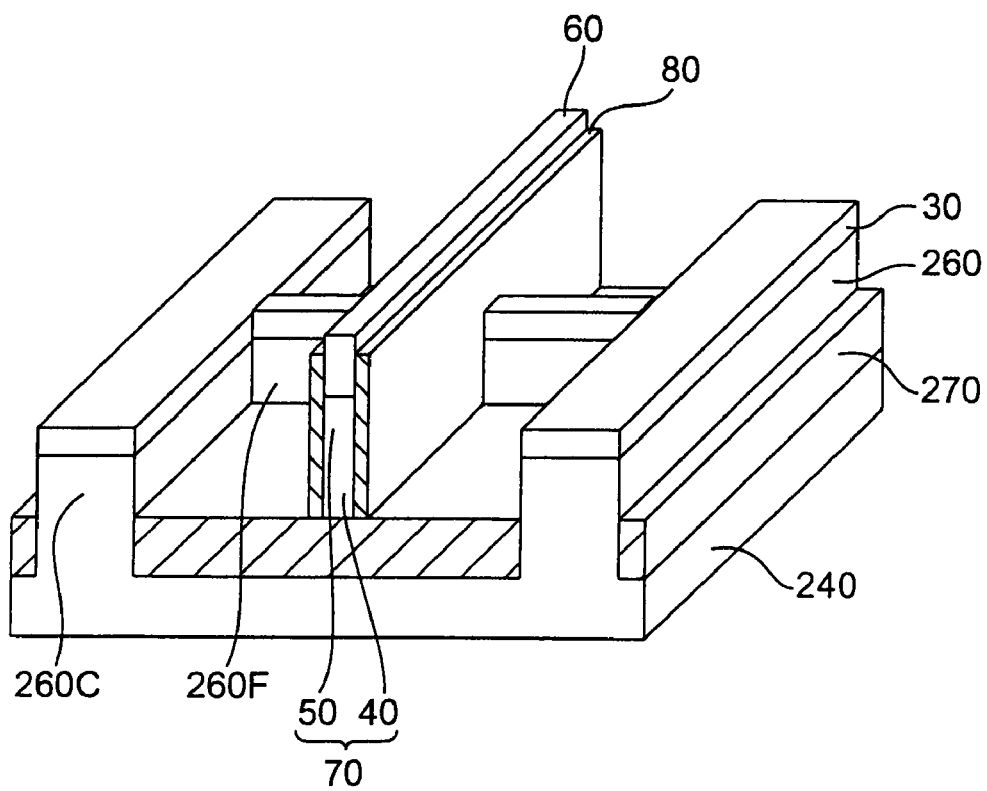
FIG. 20 is a longitudinal sectional view showing a cross-sectional structure of the element in each step in the method for manufacturing the same semiconductor device.
Figure 21:
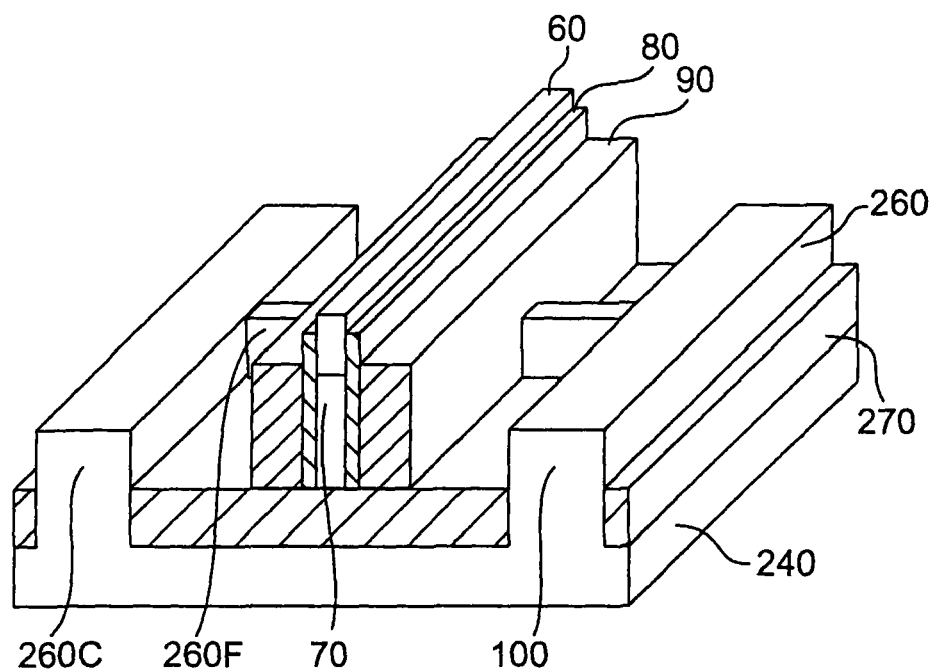
FIG. 21 is a longitudinal sectional view showing a cross-sectional structure of the element in each step in the method for manufacturing the same semiconductor device.
Figure 22:
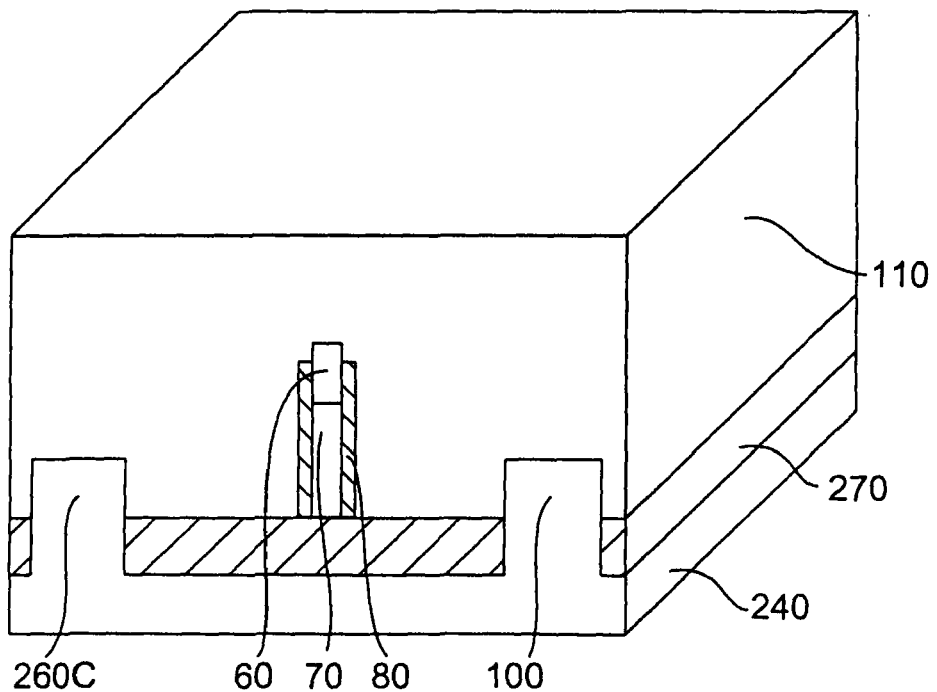
FIG. 22 is a longitudinal sectional view showing a cross-sectional structure of the element in each step in the method for manufacturing the same semiconductor device.
Figure 23:
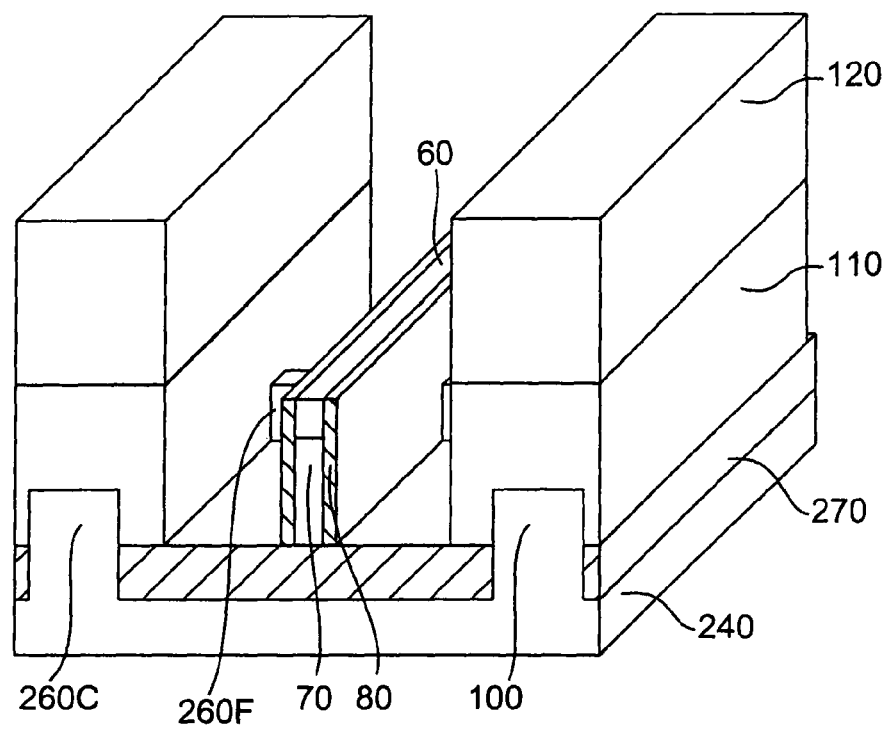
FIG. 23 is a longitudinal sectional view showing a cross-sectional structure of the element in each step in the method for manufacturing the same semiconductor device.
Figure 24:
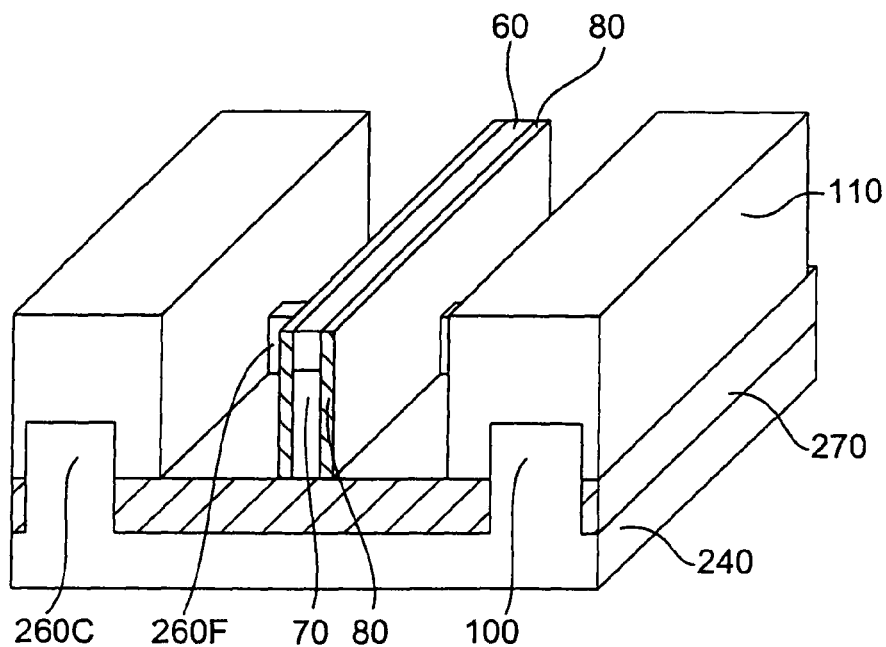
FIG. 24 is a longitudinal sectional view showing a cross-sectional structure of the element in each step in the method for manufacturing the same semiconductor device.

First, as FIG. 19 shows, an ordinary semiconductor substrate 240 is prepared. After depositing a mask material 30 composed, for example, of silicon nitride film on the semiconductor substrate 240, the mask material 30 is patterned using lithography or RIE.

Further, the semiconductor substrate 240 is etched to a depth of about 70 nm using the mask material 30 as a mask to form a convex semiconductor layer 260 composed of a fin 260F and a contact plug forming region 260C.

After depositing an element isolating insulating film 270 composed for example of a silicon oxide film on the entire surface using high-density plasma (HDP) CVD, the upper surface of the mask material 30 is exposed by planarizing the element isolating insulating film 270 by CMP using the mask material 30 as a stopper. The element isolating insulating film 270 is etched by RIE using the mask material 30 as a mask to reduce the thickness of the element isolating insulating film 270 to about 30 nm.

Thereafter, by implementing steps shown in FIGS. 20 to 28, which are same as the steps shown in FIGS. 2 to 10 of the first embodiment, a FinFET 280, which is a PMOSFET, is manufactured.

Figure 25:
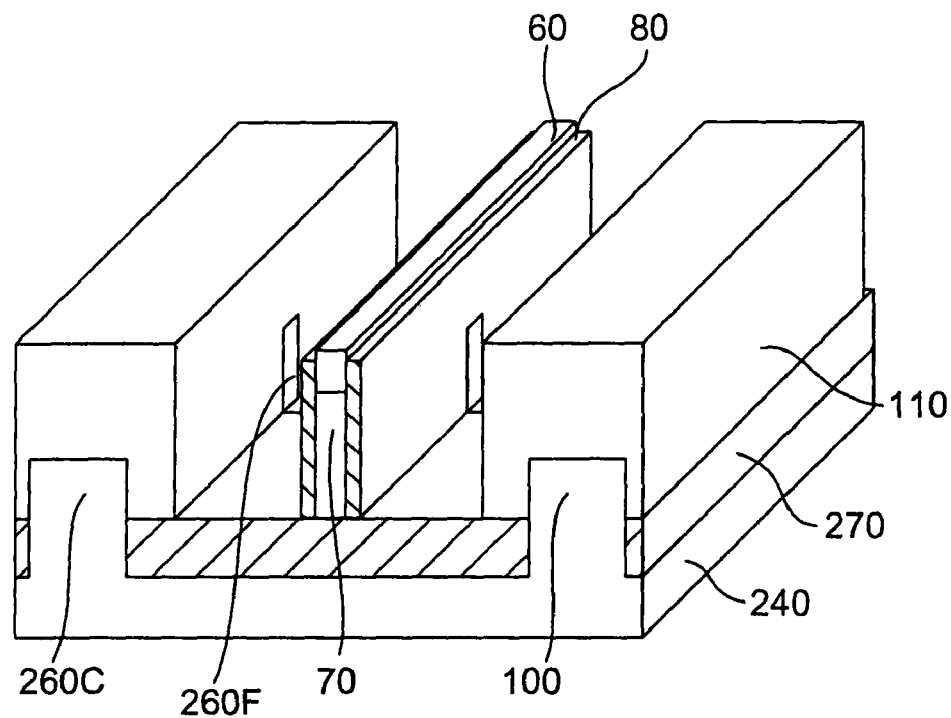
FIG. 25 is a longitudinal sectional view showing a cross-sectional structure of the element in each step in the method for manufacturing the same semiconductor device.
Figure 26:
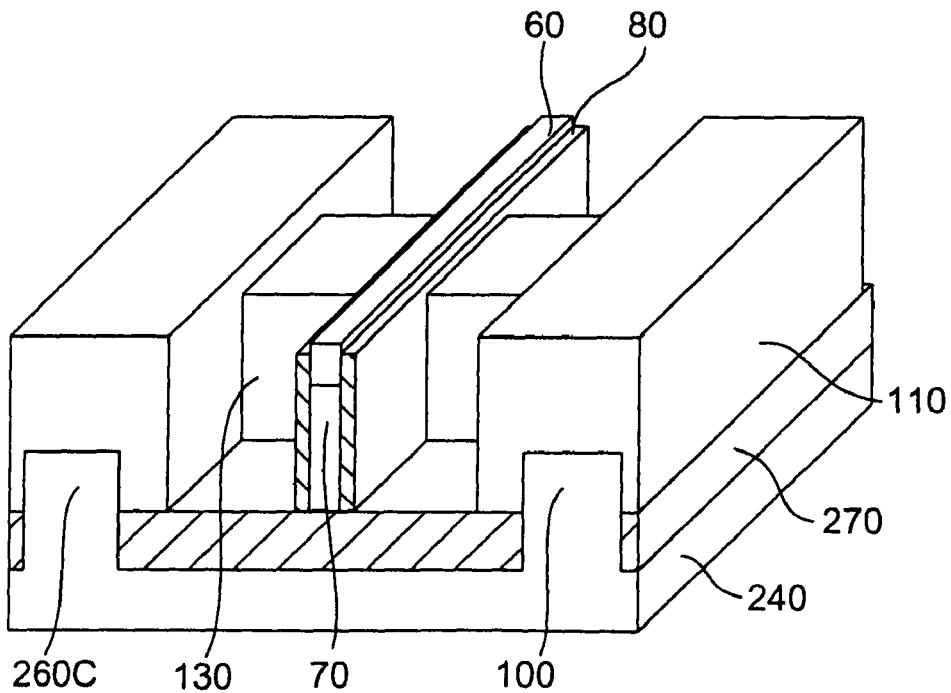
FIG. 26 is a longitudinal sectional view showing a cross-sectional structure of the element in each step in the method for manufacturing the same semiconductor device.
Figure 27:
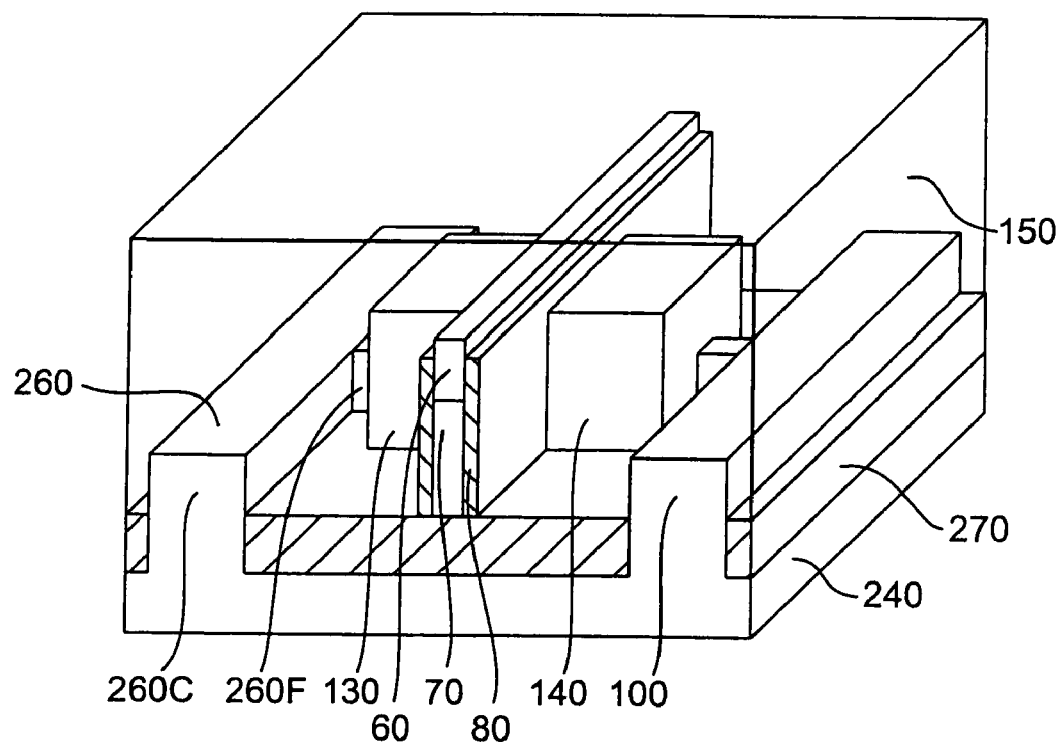
FIG. 27 is a longitudinal sectional view showing a cross-sectional structure of the element in each step in the method for manufacturing the same semiconductor device.
Figure 28:
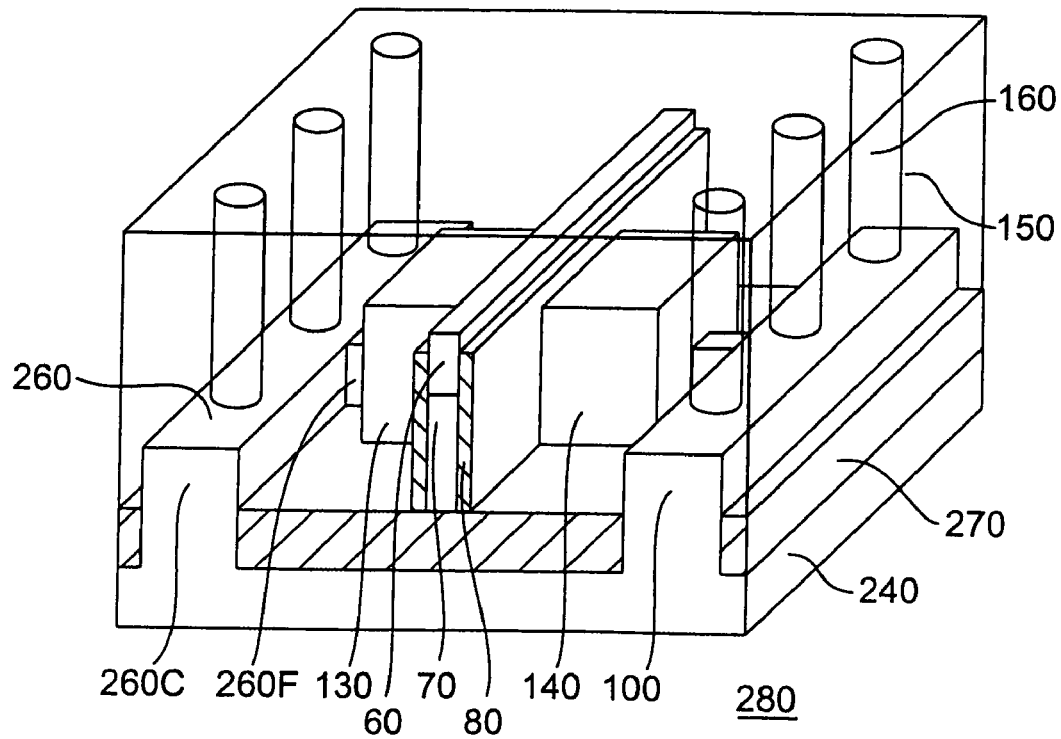
FIG. 28 is a longitudinal sectional view showing a cross-sectional structure of the element in each step in the method for manufacturing the same semiconductor device.

In the third embodiment, as FIG. 25 shows, when the exposed fin 260F is removed, the fin 260F is exposed not only on the first gate electrode sidewalls 80 and the sides of the insulating film 110, but also on the upper surface of the element isolating insulating film 270.

In this case, a fin 130 which is higher and wider than the fin 260F is formed by the epitaxial growth of silicon germanium by vapor-phase growth or solid-phase growth using the fin 260F exposed on the first gate electrode sidewalls 80 and the sides of the insulating film 110, and the upper surface of the element isolating insulating film 270 as the seed.

At this time, if the fin 260F is etched so that the upper surface of the fin 260F is ten-odd nanometers lower than the upper surface of the element isolating insulating film 270, a silicon germanium can be formed evenly from the upper portion to the bottom of the fin 130.

As described above, according to the third embodiment, in the same manner as in the first embodiment, while improving the mobility of carriers, the abnormal growth of silicide can be suppressed and the generation of junction leakage current can be suppressed.

Also according to the third embodiment, in the same manner as in the first embodiment, a silicon germanium can be formed evenly from the upper portion to the bottom of the fin 130, and thereby, the mobility of carriers can be improved evenly from the upper portion to the bottom of the channel region.

Also according to the third embodiment, in the same manner as in the first embodiment, parasitic resistance can be reduced by forming a fin 130 higher and wider than the fin 260F.

Also according to the third embodiment, in the same manner as in the first embodiment, the complete disappearance of silicon in the source/drain forming region including the contact plug forming region 260C can be prevented when a part of the fin 260F of the semiconductor layer 260 is removed, and thereby, the impossibility of epitaxial growth of silicon germanium can be avoided.

Further according to the third embodiment, in the same manner as in the first embodiment, since the source/drain region 100 that requires a high-temperature heating step is formed before the formation of the source/drain extension region 140, change in the impurity concentration distribution of the source/drain extension region 140 can be suppressed.

(4) Fourth Embodiment

FIGS. 29 to 33 illustrate the method for manufacturing a FinFET according to the fourth embodiment of the present invention. Since the steps of FIGS. 19 and 20 of the third embodiment are identical to the steps in the fourth embodiment, the description thereof will be omitted.

Figure 29:
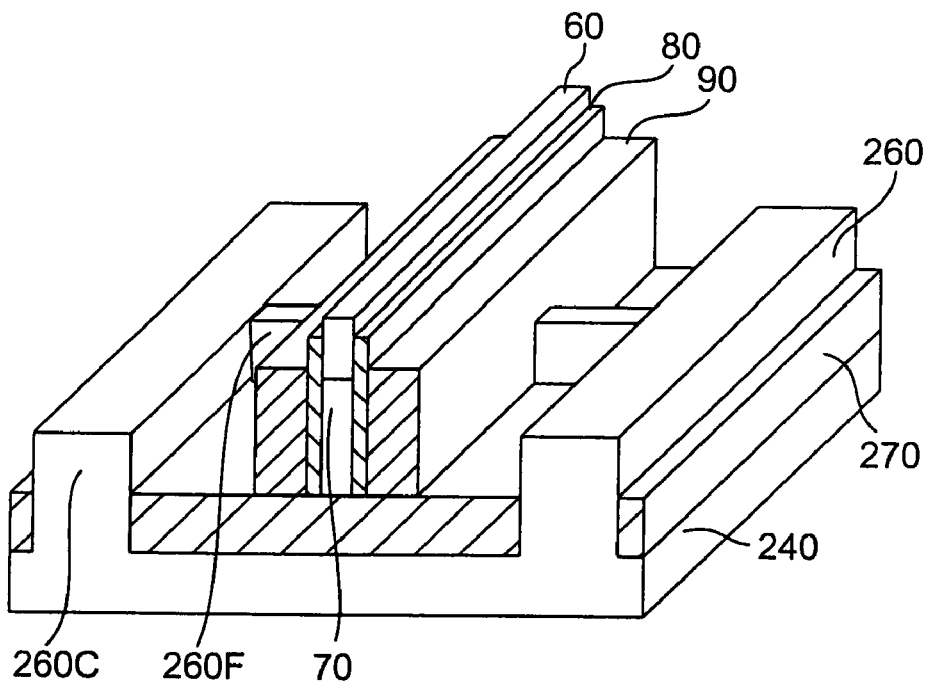
FIG. 29 is a longitudinal sectional view showing a cross-sectional structure of an element in each step in the method for manufacturing a semiconductor device according to the fourth embodiment of the present invention.

In the structure shown in FIG. 29, by the ion implantation of an impurity, such as boron (B), into the fin 260F before forming the second gate electrode sidewalls 90, a source/drain extension region (not shown) having a shallow junction depth in the lateral direction in FIG. 29 and a sharp impurity concentration distribution is formed on the fin 260F.

Then, after depositing a second gate electrode sidewall material on the entire surface, the second gate electrode sidewall material is etched by RIE to form second gate electrode sidewalls 90 on the sides of the first gate electrode sidewalls 80.

At this time, the mask material 30 formed on the source/drain forming region where a source/drain region will be subsequently formed is removed, and the thickness of the mask material 60 formed on the gate electrode 70 is made to be about 50 nm.

Figure 30:
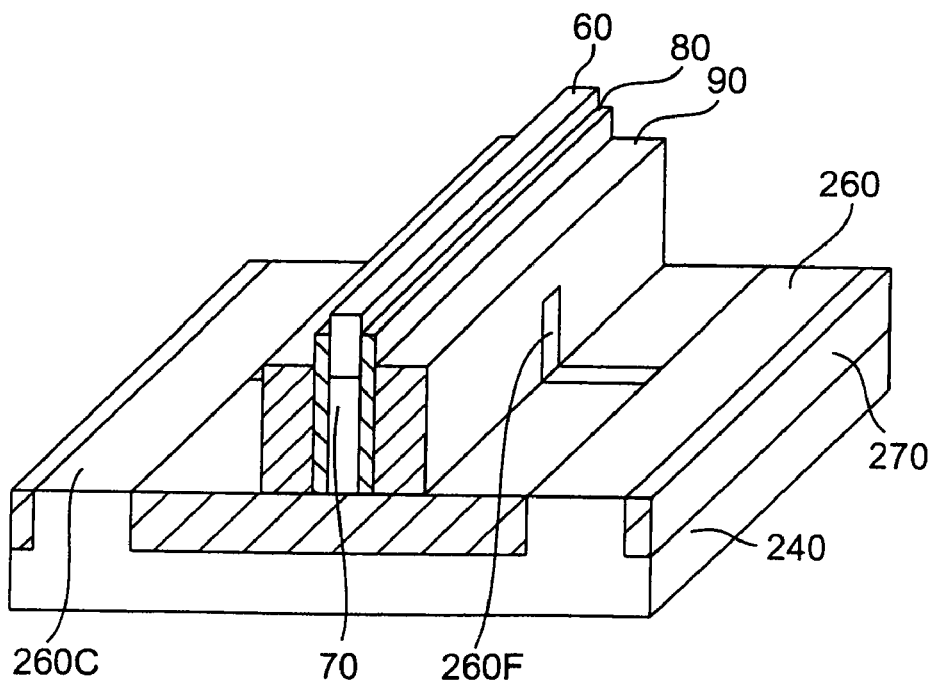
FIG. 30 is a longitudinal sectional view showing a cross-sectional structure of the element in each step in the method for manufacturing the same semiconductor device.

As FIG. 30 shows, the exposed semiconductor layer 260 (source/drain forming region consisting of the contact plug forming region 260C and a part of the fin 260F) is etched off by RIE.

Figure 31:
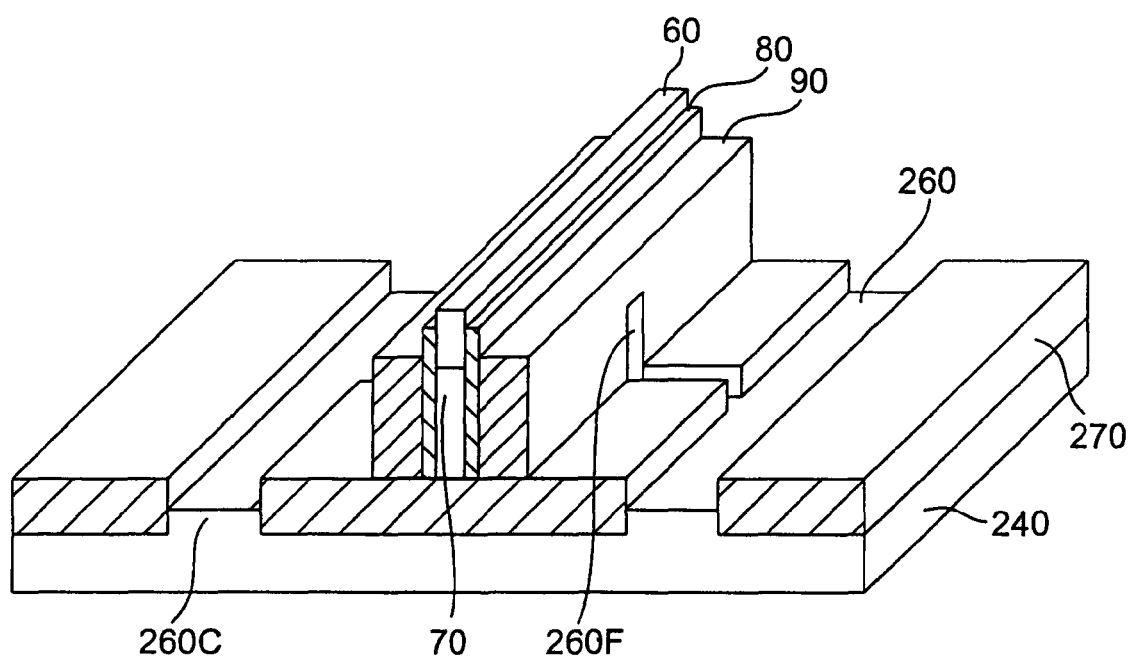
FIG. 31 is a longitudinal sectional view showing a cross-sectional structure of the element in each step in the method for manufacturing the same semiconductor device.

At this time, as FIG. 31 shows, if the semiconductor layer is etched so that the upper surface of the semiconductor 260 is ten-odd nanometers lower than the upper surface of the element isolating insulating film 270, a silicon germanium layer can be formed evenly from the upper portion to the bottom of the fin 260F.

Figure 32:
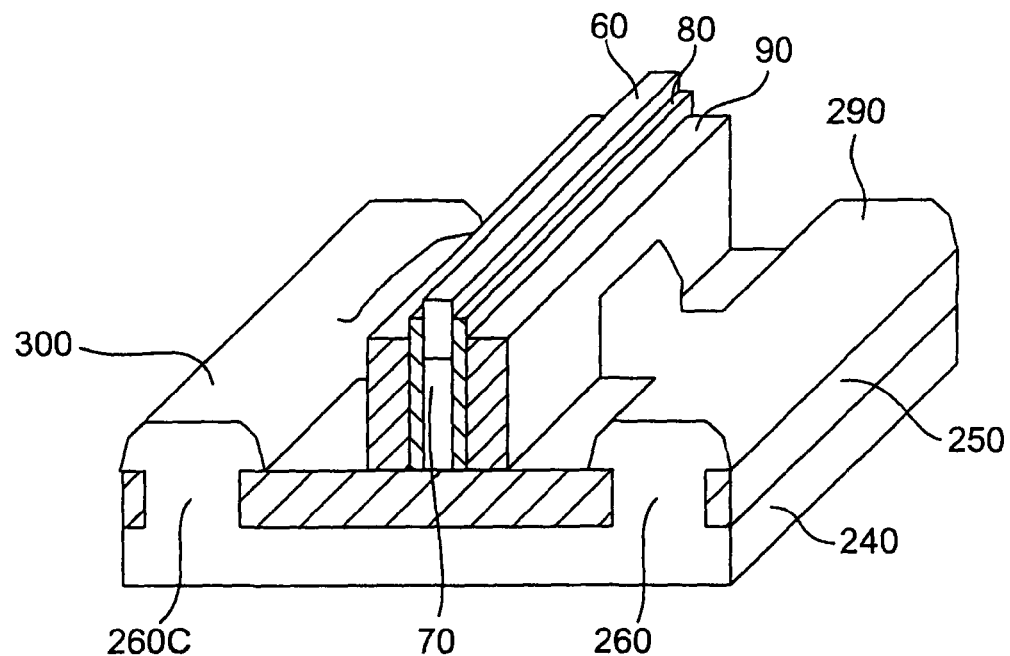
FIG. 32 is a longitudinal sectional view showing a cross-sectional structure of the element in each step in the method for manufacturing the same semiconductor device.

As FIG. 32 shows, by vapor-phase growth or solid-phase growth, a silicon germanium layer 290 is formed by the epitaxial growth of silicon germanium using the semiconductor layer 260 exposed on the sides of the second gate electrode sidewalls 90 and the upper surface of the element isolating insulating film 270 as seeds.

Thereafter, by the ion implantation into the silicon germanium layer 290, the source/drain region 300 having a deep junction depth in the lateral direction in FIG. 32 is formed on the silicon germanium layer 290.

Figure 33:
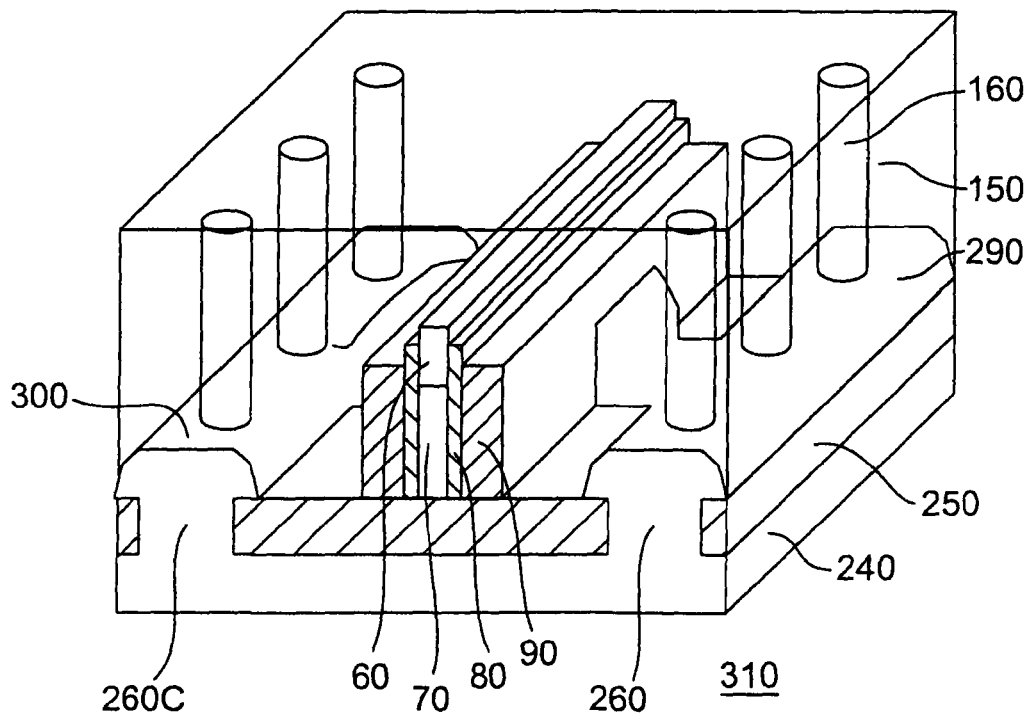
FIG. 33 is a longitudinal sectional view showing a cross-sectional structure of the element in each step in the method for manufacturing the same semiconductor device.

As FIG. 33 shows, in the same manner as in the first embodiment, by sequentially forming the interlayer insulating film 150 and contact plugs 160 and performing a wiring step, a FinFET 310, that is a PMOSFET, is manufactured.

As described above, according to the fourth embodiment, the mobility of carriers can be improved.

Also according to the fourth embodiment, in the same manner as in the first embodiment, a silicon germanium layer 290 can be formed evenly from the upper portion to the bottom of the fin 260F, and thereby, the mobility of carriers can be improved evenly from the upper portion to the bottom of the channel region.

Also according to the fourth embodiment, in the same manner as in the first embodiment, parasitic resistance can be reduced by forming the silicon germanium layer 290 higher and wider than the fin 260F.

Also according to the fourth embodiment, even if the exposed semiconductor layer 260 (source/drain forming region consisting of the contact plug forming region 260C and a part of the fin 260F) is removed, silicon germanium can be epitaxially grown using the semiconductor layer 260 exposed on the sides of the second gate electrode sidewalls 90 and the upper surface of the element isolating insulating film 270 as seeds.

The above-described embodiments are examples, and do not limit the present invention. For example, by the epitaxial growth of silicon carbide (SIC) in place of silicon germanium, an NMOSFET can be formed as a FinFET.

What is claimed is:

1. A method for manufacturing a semiconductor device, comprising:
    depositing a mask material on a first semiconductor layer formed of silicon on a semiconductor substrate via a buried insulating film, and patterning the mask material and the first semiconductor layer, to form the first semiconductor layer having a convex shape;

forming gate insulating films on a pair of facing sides of the first semiconductor layer;

depositing a gate electrode material on the buried insulating film, the gate insulating films, and the mask material, and pattering the gate electrode material, to form a gate electrode on the pair of facing sides and the upper surface of the first semiconductor layer via the gate insulating films and the mask material;

forming gate electrode sidewalls on the sides of the gate electrode, and removing the mask material formed on the first semiconductor layer and not coated by the gate electrode and the gate electrode sidewalls;

forming a source region and a drain region by the ion implantation of a predetermined impurity into the first semiconductor layer using the gate electrode and the gate electrode sidewalls as masks;

forming an insulating film on the buried insulating film, the first semiconductor layer, the gate electrode, and the gate electrode sidewalls;

planarizing the insulating film, and selectively removing the gate electrode sidewalls by wet etching to expose a part of the first semiconductor layer;

removing the masks, and etching off the exposed first semiconductor layer;

forming a second semiconductor layer composed of silicon germanium or silicon carbide on the removed region; and forming a source extension region and a drain extension region by the ion implantation of a predetermined impurity into the second semiconductor layer using the gate electrode and the insulating film as the masks.

2. The method for manufacturing a semiconductor device according to claim 1, wherein the gate electrode sidewalls which has a higher etching rate than the etching rate of the insulating film is formed.

3. The method for manufacturing a semiconductor device according to claim 2, wherein when a part of the first semiconductor layer is exposed, the gate electrode sidewalls are selectively removed by wet etching using hot phosphoric acid.

4. The method for manufacturing a semiconductor device according to claim 1, wherein the second semiconductor layer is formed so that the surface of the second semiconductor layer is positioned outside the surface of the first semiconductor layer.

5. The method for manufacturing a semiconductor device according to claim 1, wherein the second semiconductor layer is formed by the epitaxial growth of the silicon germanium or the silicon carbide using vapor-phase growth or solid-phase growth using the sidewall of the first semiconductor layer exposed on the sidewalls of the insulating film as seeds.

6. The method for manufacturing a semiconductor device according to claim 1, wherein the first semiconductor layer is formed so as to have a plurality of fins.

7. The method for manufacturing a semiconductor device according to claim 6, wherein the second semiconductor layer is formed so as to connect the plurality of fins.

8. A method for manufacturing a semiconductor device, comprising:

depositing a mask material on a first semiconductor layer formed of silicon on a semiconductor substrate via a buried insulating film, and patterning the mask material and the first semiconductor layer, to form the first semiconductor layer having a convex shape;

forming gate insulating films on a pair of facing sides of the first semiconductor layer;

depositing a gate electrode material on the buried insulating film, the gate insulating films, and the mask material, and pattering the gate electrode material, to form a gate electrode on the pair of facing sides and the upper surface of the first semiconductor layer via the gate insulating films and the mask material;

forming gate electrode sidewalls on the sides of the gate electrode, and removing the mask material formed on the first semiconductor layer and not coated by the gate electrode and the gate electrode sidewalls;

forming a source region and a drain region by the ion implantation of a predetermined impurity into the first semiconductor layer using the gate electrode and the gate electrode sidewalls as masks;

forming an insulating film on the buried insulating film, the first semiconductor layer, the gate electrode, and the gate electrode sidewalls;

forming a mask having a pattern wherein the upper surfaces of the gate electrode sidewalls are opened on the insulating film;

exposing a part of the first semiconductor layer by etching the insulating film and the gate electrode sidewalls using the mask;

removing the mask, and etching off the exposed first semiconductor layer;

forming a second semiconductor layer composed of silicon germanium or silicon carbide on the removed region; and forming a source extension region and a drain extension region by the ion implantation of a predetermined impurity into the second semiconductor layer using the gate electrode and the insulating film as masks.

9. The method for manufacturing a semiconductor device according to claim 8, wherein the second semiconductor layer is formed so that the surface of the second semiconductor layer is positioned outside the surface of the first semiconductor layer.

10. The method for manufacturing a semiconductor device according to claim 8, wherein the second semiconductor layer is formed by the epitaxial growth of the silicon germanium or the silicon carbide using vapor-phase growth or solid-phase growth using the sidewall of the first semiconductor layer exposed on the sidewalls of the insulating film as seeds.

11. The method for manufacturing a semiconductor device according to claim 8, wherein the first semiconductor layer is formed so as to have a plurality of fins.

12. The method for manufacturing a semiconductor device according to claim 11, wherein the second semiconductor layer is formed so as to connect the plurality of fins.

* * * * *